United States Patent
Wang (10) Patent No.: US 7,989,246 B2
(45) Date of Patent: Aug. 2, 2011

(54) PACKAGE METHOD OF MICRO-ELECTRO-MECHANICAL SYSTEM CHIP

(75) Inventor: Chuan-Wei Wang, HsinChu (TW)

(73) Assignee: PixArt Imaging Incorporation, Hsin-Chu (TW)

( * ) Notice: Subject to any disclaimer, the term of this patent is extended or adjusted under 35 U.S.C. 154(b) by 0 days.

(21) Appl. No.: 12/557,805

(22) Filed: Sep. 11, 2009

(65) Prior Publication Data
US 2011/0062532 A1    Mar. 17, 2011

(51) Int. Cl.
*H01L 21/00* (2006.01)
*H01L 21/30* (2006.01)
*H01L 21/302* (2006.01)
(52) U.S. Cl. ......... 438/48; 438/106; 438/456; 438/689
(58) Field of Classification Search .................. None
See application file for complete search history.

(56) References Cited

U.S. PATENT DOCUMENTS

| | | | | |
|---|---|---|---|---|
| 6,514,789 | B2* | 2/2003 | Denton et al. | 438/106 |
| 6,872,319 | B2* | 3/2005 | Tsai | 216/2 |
| 7,049,164 | B2* | 5/2006 | Bruner | 438/32 |
| 2004/0077154 | A1* | 4/2004 | Nagarajan et al. | 438/455 |
| 2005/0009246 | A1* | 1/2005 | Enquist et al. | 438/127 |
| 2007/0048898 | A1* | 3/2007 | Carlson et al. | 438/106 |

* cited by examiner

*Primary Examiner* — Scott B Geyer
(74) *Attorney, Agent, or Firm* — Tung & Associates (57) ABSTRACT

The present invention proposes a MEMS chip and a package method thereof. The package method comprises; making a capping wafer by: providing a first substrate and forming an etch stop layer on the first substrate; making a device wafer by: providing a second substrate and forming a MEMS device and a material layer surrounding the MEMS device on the second substrate; bonding the capping wafer and the device wafer; after bonding, etching the first substrate to form at least one via; etching the etch stop layer through the via; etch the material layer; and forming a sealing layer on the first substrate.

20 Claims, 7 Drawing Sheets

PACKAGE METHOD OF MICRO-ELECTRO-MECHANICAL SYSTEM CHIP

BACKGROUND OF THE INVENTION

1. Field of Invention

The present invention relates to a Micro-Electro-Mechanical System (MEMS) chip and a package method thereof.

2. Description of Related Art

In a process for making a MEMS chip, an internal MEMS device, such as a micro-acoustical sensor, gyro-sensor, or accelerometer, is often required to be packaged in a sealed space to maintain its stability. Conventionally, a package process is performed after the MEMS device is "released", i.e., after the MEMS device becomes a movable structure by an etching step. A device wafer with the MEMS device formed therein is bonded with a capping wafer by a bonding material such as aluminum or glass material. However, when the MEMS device is made by a CMOS compatible process, because the MEMS device is packaged after it is released, and since the MEMS device made by the CMOS compatible process uses aluminum or other material which can not sustain high temperature, the package method suffers many constraints. In addition, the MEMS device made by the CMOS compatible process is also more likely to be damaged during the package process.

The present invention provides a MEMS chip structure and a package method thereof to reduce the impact by the temperature and enhance the yield of the MEMS device.

SUMMARY OF THE INVENTION

The first objective of the present invention is to provide a package method of a MEMS chip, which solves the foregoing problem by packaging the MEMS chip before releasing the MEMS device.

Another objective of the present invention is to provide a MEMS chip with the foregoing package method.

In order to achieve the foregoing objectives, in one perspective of the present invention, it provides a package method of a MEMS chip, comprising the following steps:

making a capping wafer by: providing a first substrate; and forming an etch stop layer on the first substrate;

making a device wafer by: providing a second substrate; and forming a MEMS device and a material layer surrounding the MEMS device on the second substrate;

bonding the capping wafer and the device wafer;

after bonding, etching the first substrate to form at least one via;

etching the etch stop layer through the via; and etching the material layer.

After the foregoing steps are completed, preferably, a sealing layer is deposited on the first substrate.

In the foregoing method, preferably, the etch stop layer and the material layer are made of the same material, or have a similar etch rate to a certain etchant. The etch stop layer is only required to cover the via formed in the first substrate; its pattern is not required to be very precise.

The capping wafer and the device wafer can be bonded by hermetical package or non-hermetical package. The hermetical package for example includes glass frit or solder, wherein the solder material for example can be a material including metal or alloy. An insulation layer is preferably formed on the device wafer when metal or alloy is employed for hermetical package. In non-hermetical package, for example, photosensitive polymer can be used as a bonding material. The pattern of the bonding material can be defined by lithography or by lithography and etching, depending on the property of the bonding material.

In another perspective of the present invention, it provides a MEMS chip comprising:

a first segment including: a sealing layer; and a first substrate below the sealing layer wherein the substrate has a cavity being sealed;

a second segment including: a second substrate; and a MEMS device on the second substrate; and a bonding layer bonding the first segment and the second segment.

The objectives, technical details, features, and effects of the present invention will be better understood with regard to the detailed description of the embodiments below, with reference to the drawings.

DESCRIPTION OF THE PREFERRED EMBODIMENTS

The drawings as referred to throughout the description of the present invention are for illustration only, to show the interrelationships between the process steps and between the layers, but not drawn according to actual scale.

One characteristic of the present invention is that a wafer including a MEMS device (hereinafter referred to as "device wafer") is first bonded to a capping wafer, and after bonding and packaging, the MEMS device inside the package is etched to release. Because the MEMS device has not yet been released during the package process (the MEMS device is still a part of the device wafer and not movable), it is more capable of sustaining high temperature and less likely to be damaged.

Figure 1:
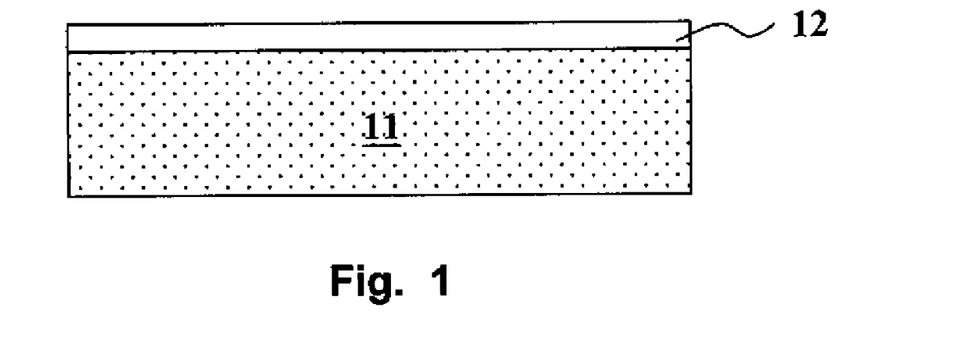
FIGS. 1-3 show the first embodiment for making a capping wafer according to the present invention.
Figure 2:
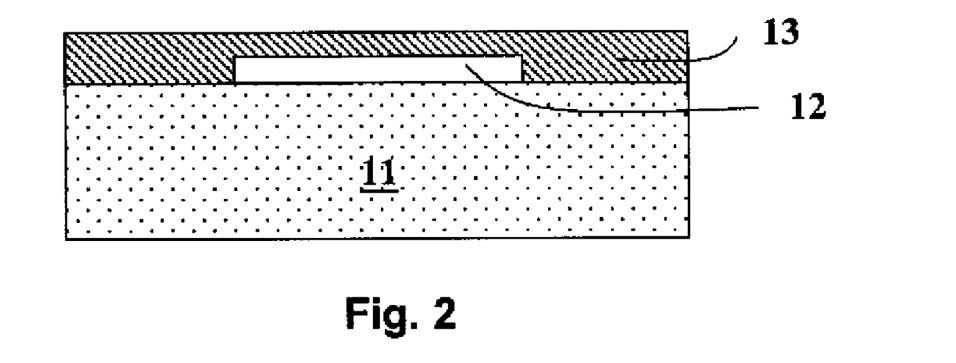
Figure 3:
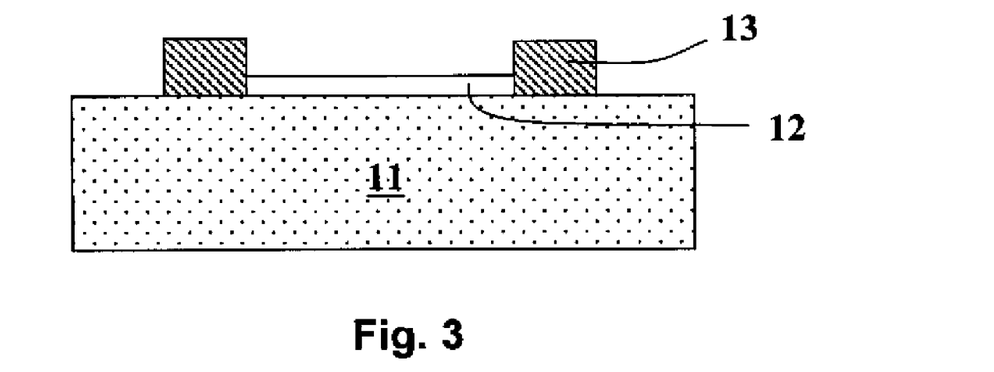

According to the present invention, there are various methods to make and bond the capping wafer and the device wafer. FIGS. 1-3 show the first embodiment of the present invention for making the capping wafer. As shown in FIG. 1, a first substrate 11, e.g., a silicon substrate, is provided, and next an etch stop layer 12 is deposited on the substrate 11. The material selection of the etch stop layer 12 will be discussed later. Because the etch stop layer 12 is provided for masking the substrate 11 during etching, when the substrate 11 is made of silicon, the etch stop layer 12 should have a higher etch selectivity to silicon; when the substrate 11 is made of another material, the etch stop layer 12 should have a higher etch selectivity to said other material. Next, the etch stop layer 12 is patterned, for example by inductive coupling plasma (ICE) etch. Afterward, a first bonding layer 13 is formed on the capping wafer, and patterned. In one embodiment, the first bonding layer 13 is selected from a material which can be patterned by photolithography, such as one of the followings: photosensitive polymer, parlene, PDMS (Polydimethylsiloxane), and photo-imagable resin. In this embodiment, it is only required to perform a photolithography step on the first bonding layer 13 according to a desired pattern, and then removing the undesired part. In another embodiment, the first bonding layer 13 is made of glass frit or solder. In this embodiment, the pattern needs to be defined by another way, such as by lithography and etch. When the bonding layer 13 is made of solder, the material selection will be discussed later.

Figure 4:
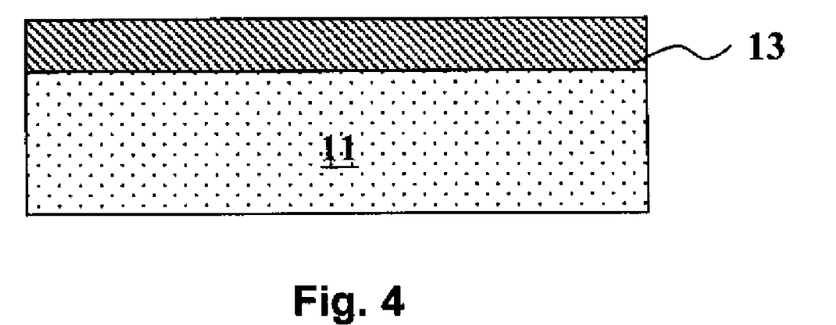
FIGS. 4-6 show the second embodiment for making the capping wafer according to the present invention.
Figure 5:
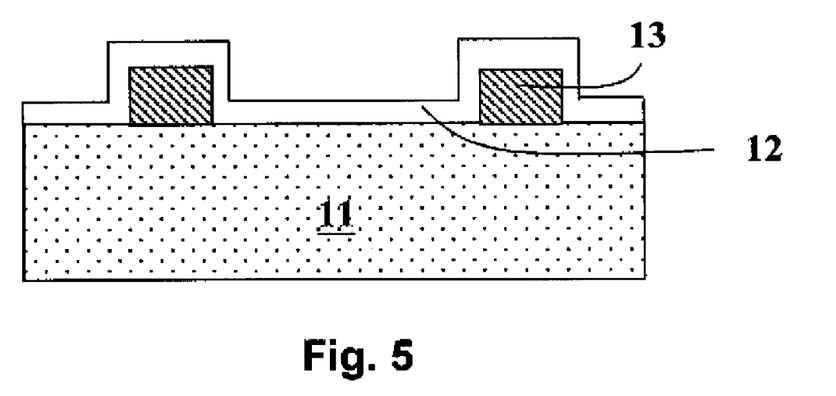
Figure 6:
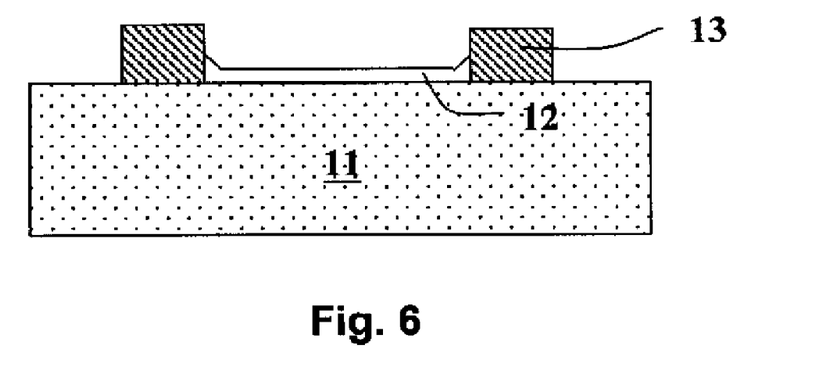

When the first bonding layer 13 is not selected from a material which can be patterned by photolithography, it is not necessary to form the etch stop layer 12 and the bonding layer 13 in order. Instead, they can be formed in either the order as shown in FIGS. 1-3 or the order as shown in FIGS. 4-6, wherein the first bonding layer 13 is formed first and the etch stop layer 12 next.

Figure 7:
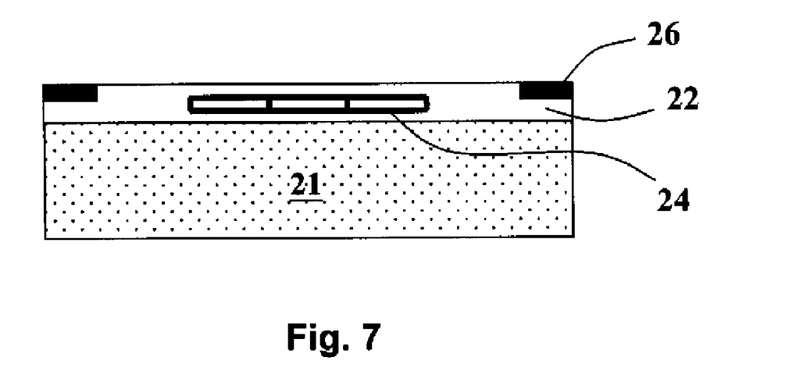
FIGS. 7-8 show the first embodiment for making a device wafer according to the present invention.
Figure 8:
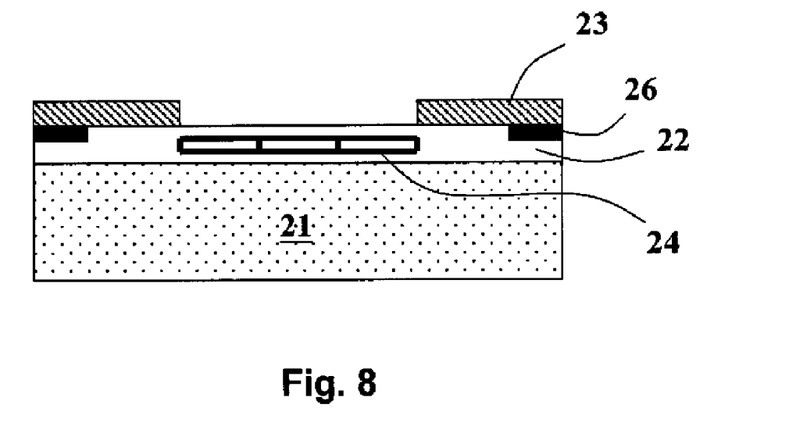
Figure 9:
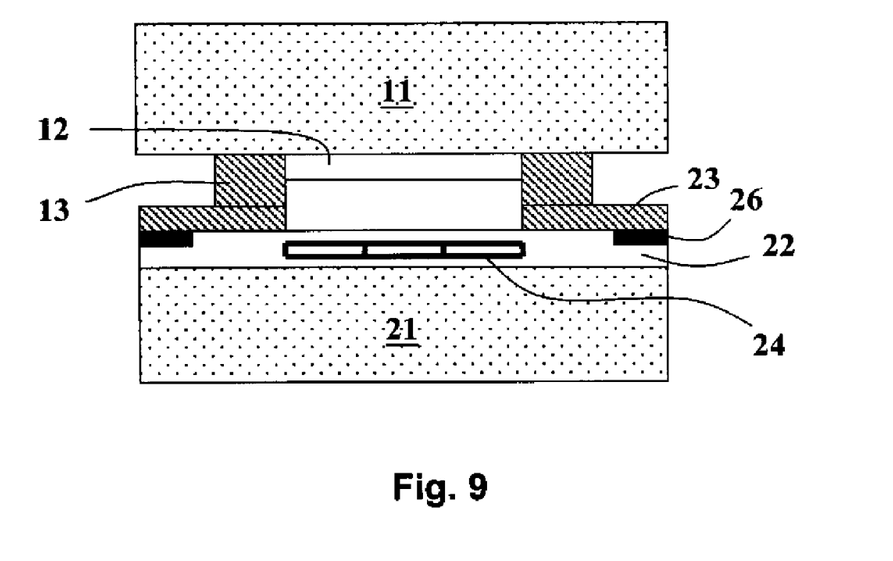
FIGS. 9-13 are steps of bonding the capping wafer and the device wafer according to the present invention.
Figure 10:
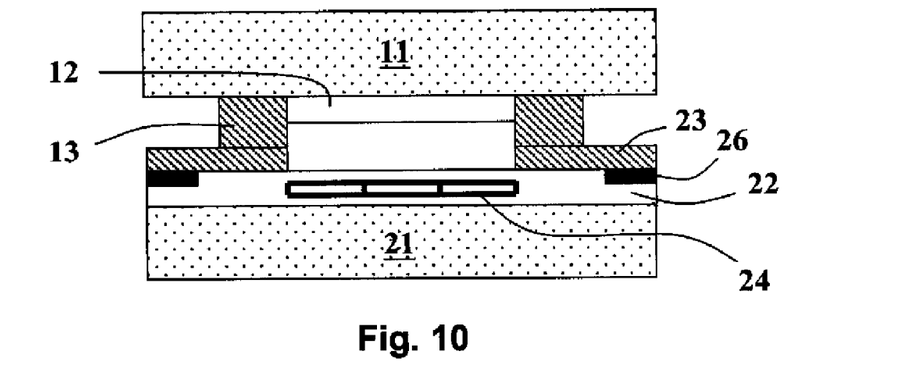

A method for making the device wafer is shown in FIGS. 7-8. First, a second substrate 21, for example made of silicon, is provided. A MEMS device 24 and a material layer 22 surrounding the MEMS device are formed on the second substrate 21. The MEMS device 24 can be of any shape and any number of layers; what is shown is only for example. The material layer 22 can be made of any material used for insulation between metal layers in a standard CMOS process, and it may be of the same material as that of the etch stop layer 12 or not, but preferably the same. In one preferred embodiment, the etch stop layer 12 and the material layer 22 are both made of oxide, such as silicon dioxide. At or after forming the MEMS device 24 and the material layer 22, a bond pad 26 is formed as well, for connection to external circuitry. After the abovementioned steps are completed, a second bonding layer 23 corresponding to the first bonding layer 13 is formed subsequently; the material selection thereof will be discussed later.

Referring to FIGS. 9-13, after the capping wafer and the device wafer are completed (which may be done in parallel), they are bonded by means of the first bonding layer 13 and the second bonding layer 23. There are various combinations of the materials of the first bonding layer 13 and the second bonding layer 23. For example, the first bonding layer 13 can be made of the abovementioned photosensitive polymer, including: parlene, PDMS, or photo-imagable resign; and the second bonding layer 23 can be made of a material which is the same as the first bonding layer 13, or epoxy. In this case, the capping wafer and the device wafer are bonded by non-hermetical package. Or, the first bonding layer 13 and the second bonding layer 23 can be bonded by glass frit; in this case a hermetical package is formed.

Figure 11:
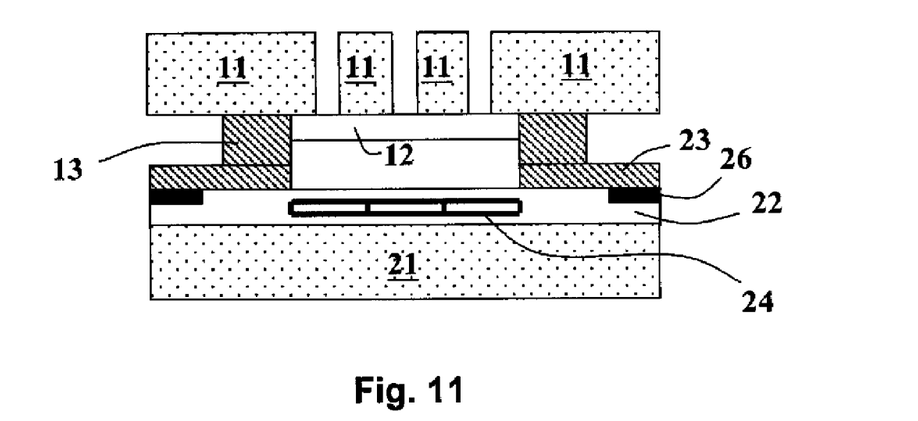
Figure 12:
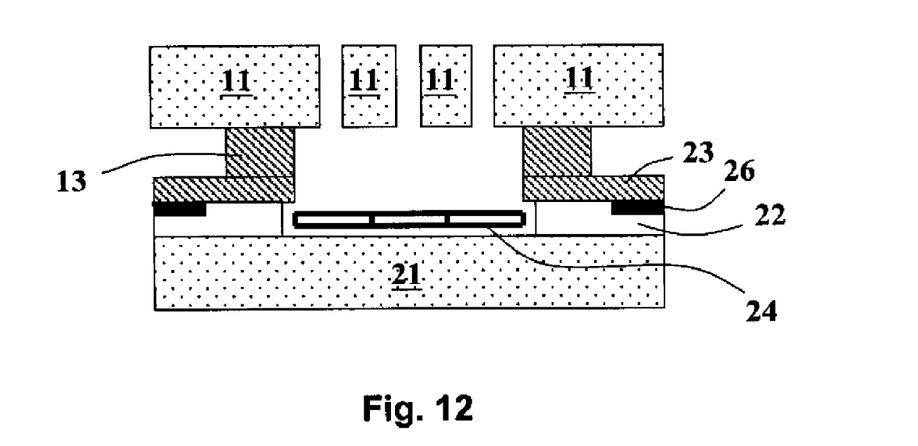
Figure 13:
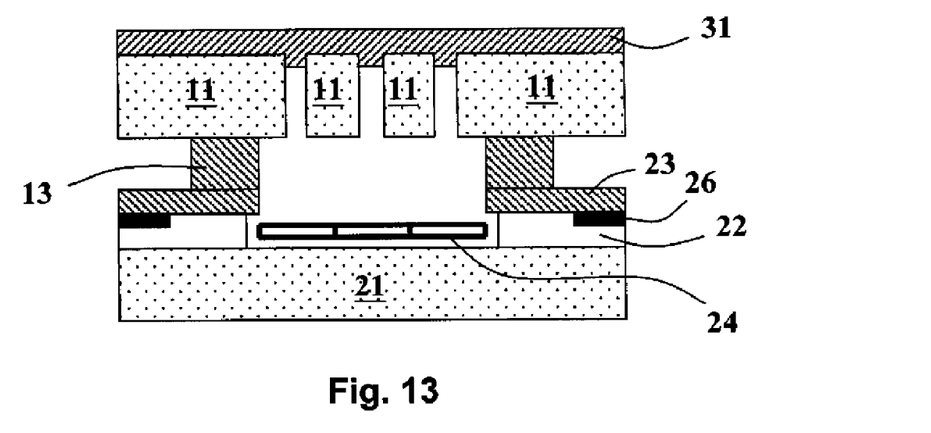
Figure 14:
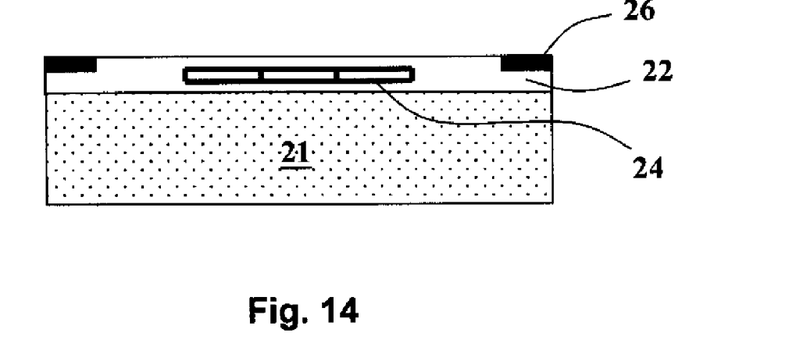
FIGS. 14-18 show the second embodiment for making the device wafer, and the steps of bonding the capping wafer and the device wafer according to the present invention.

After the capping wafer and the device wafer are bonded, in one embodiment, it is preferred to reduce the thickness of the first substrate 11, the second substrate 21, or both, by grinding; for example, the first substrate 11 may be controlled within a thickness range between 100 μm~200 μm. Next, the first substrate 11 is etched, for example by ICP etch, such that at least one via is formed as shown in FIG. 11. The effect of the etch stop layer 12 can be understood by now, and because the pattern of the etch stop layer 12 is only required to cover the via, it does not have to be very precise. Next, through the via formed in the first substrate 11, the etch stop layer 12 and the material layer 22 are removed by etching as shown in FIG. 12. This explains why the etch stop layer 12 and the material layer 22 are preferably made of the same material. Yet, they can certainly be made of different materials as well; in this case, one may need to use different etchants to etch the etch stop layer 12 and the material layer 22. If the etch stop layer 12 and the material layer 22 are both made of oxide, the etchant for example can be vapor hydrogen fluoride (HF). After the material layer 22 is etched, the MEMS device 24 is released and becomes a movable part. At last, preferably, a sealing layer 31 is provided to seal the via in the first substrate 11; the sealing layer 31 can be made of any material capable of achieving the sealing function, including but not limited to metal, as shown in FIG. 13. The wafer as shown in FIG. 13 may subsequently be sliced into multiple chips (one wafer contains multiple chips and FIGS. 1-21 of the present invention show only one chip for illustration).

Figure 15:
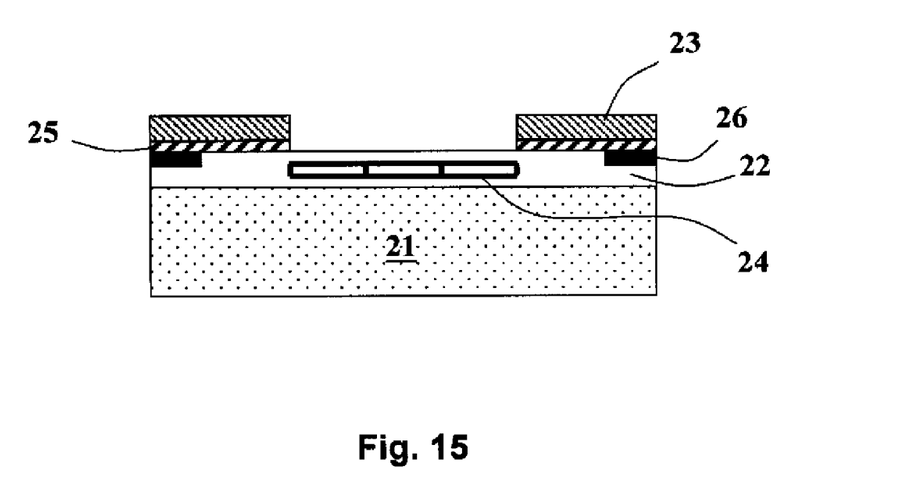
Figure 16:
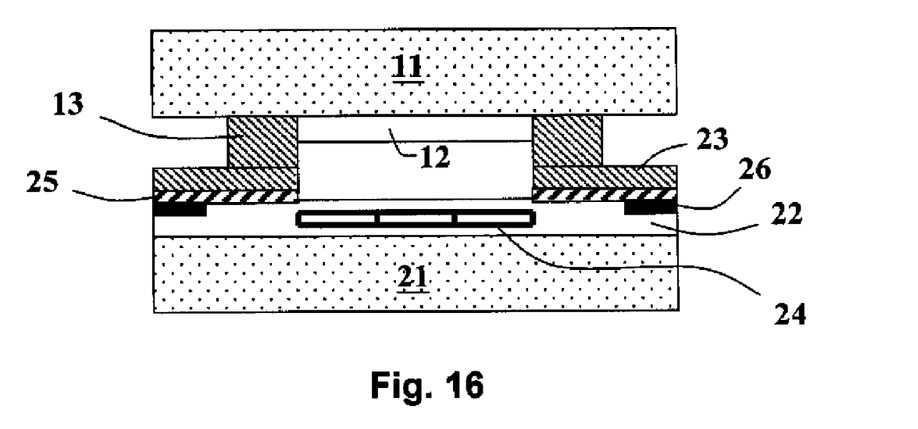
Figure 17:
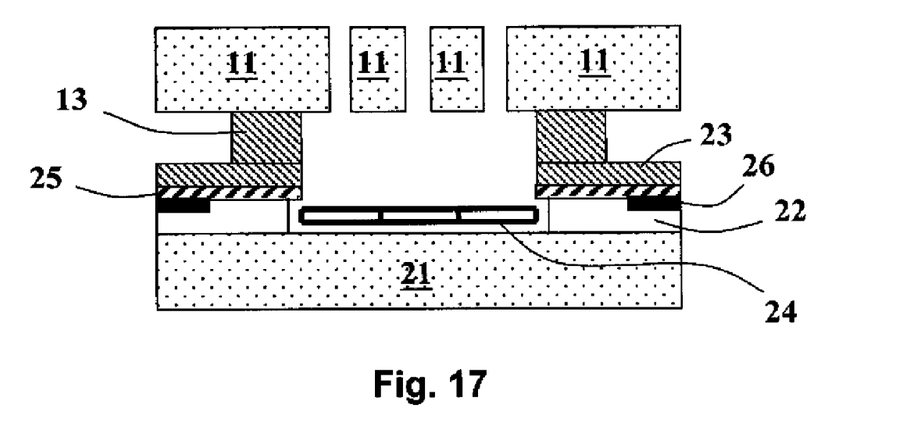
Figure 18:
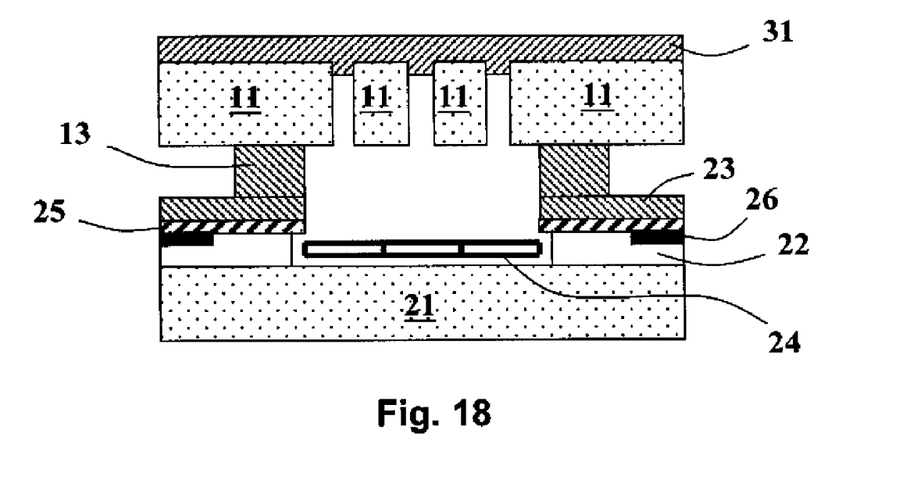

FIGS. 14-18 illustrate another embodiment of the present invention. In this embodiment, a capping wafer and a device wafer are bonded by soldering; the bonding layer 23 is made of a material including metal or alloy. The first bonding layer 13 and the second bonding layer 23 are made of a material suitable for soldering, including but not limited to: metal, aluminum-silicon alloy, silicon-gold alloy, tin-silver alloy, gold-germanium alloy, gold-tin alloy, or gold-lead alloy. In such case as shown in FIG. 15, after a bond pad 26 is provided on the second substrate 21, preferably, an insulation layer 25 is deposited on the bond pad 26 to prevent the bond pad 26 from being short-circuited to the second bonding layer 23. The material of the insulation layer 25 is preferably different from the etch stop layer 12 and the material layer 22; the insulation layer 25 for example can be made of a material including silicon carbide (SiC) or amorphous silicon. Subsequent steps after FIG. 15 are shown in FIGS. 16-18, wherein the capping wafer and the device wafer are soldered; the substrate is grinded; the first substrate 11 is etched to formed a via; the etch stop layer 12 and material layer 22 are etched and removed; a sealing layer 31 is coated, etc. These steps are similar to those in the previous embodiment and their details are thus omitted here.

Figure 19:
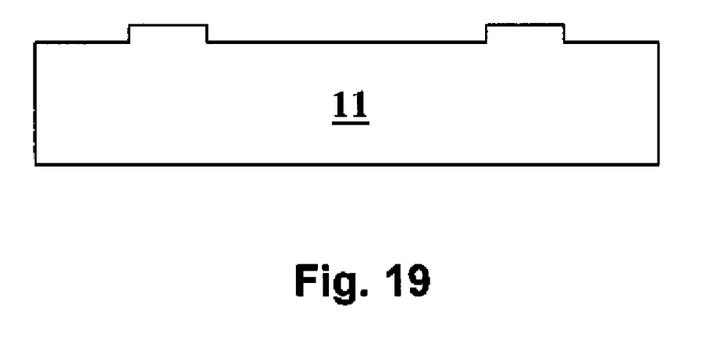
FIGS. 19-21 show the third embodiment for making the capping wafer according to the present invention.
Figure 20:
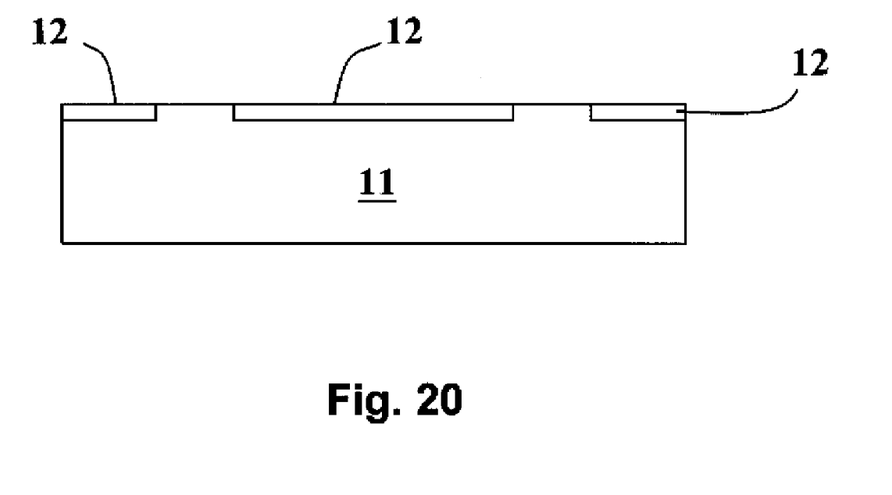
Figure 21:
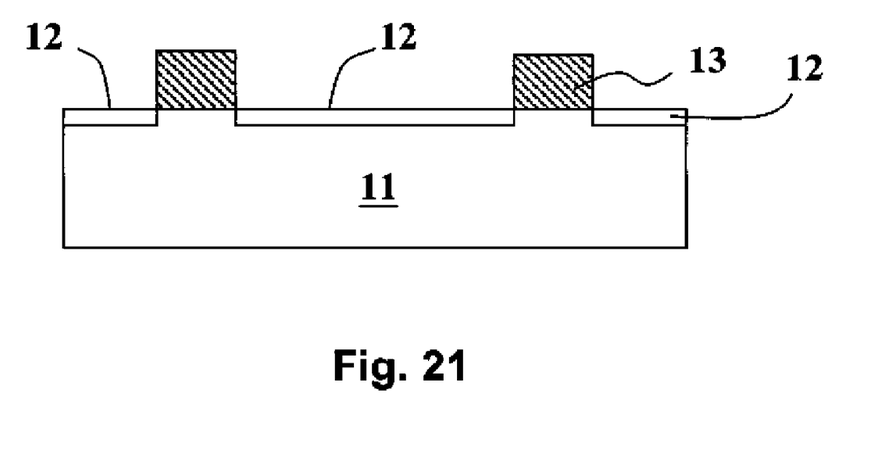

FIGS. 19-21 illustrate another embodiment of the present invention. In this embodiment, the method for making the capping wafer is slightly different from the foregoing embodiment, as the following: after providing a first substrate 11, as shown in FIG. 19, the first substrate 11 is etched according to a pattern of an etch stop layer 12 to be formed on it, the pattern being such that it covers at least the position of a via to be formed in the first substrate 11 in a subsequent process. Subsequently, an etch stop layer 12 is deposited in the region as shown in FIG. 20, and next a first bonding layer 13 is further formed as shown in FIG. 21. The capping wafer formed by this embodiment can be bonded to the device wafer by any of the methods described previously, and the details of the bonding process are omitted here.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. In view of the foregoing, the spirit of the present invention should cover all such and other modifications and variations, which should be interpreted to fall within the scope of the following claims and their equivalents.

What is claimed is:
1. A package method of a Micro-Electro-Mechanical System (MEMS) chip comprising:
　making a capping wafer by:
　　providing a first substrate; and
　　forming an etch stop layer on the first substrate; making a device wafer by:
　providing a second substrate; and
　　forming a MEMS device and a material layer surrounding the MEMS device on the second substrate;
　bonding the capping wafer and the device wafer;

after bonding, etching the first substrate to form at least one via;

etching the etch stop layer through the via; and etching the material layer.

2. The method of claim 1, further comprising: forming a sealing layer on the first substrate.

3. The method of claim 2, wherein the sealing layer is made of a material including metal.

4. The method of claim 1, wherein the etch stop layer and the material layer are made of the same material.

5. The method of claim 1, wherein the etch stop layer and the material layer are made of a material including oxide.

6. The method of claim 5, wherein the etch stop layer and the material layer are etched by vapor hydrogen fluoride (HF).

7. The method of claim 1, wherein the step of making the device wafer further includes providing a bond pad on the material layer.

8. The method of claim 7, wherein the step of making the device wafer further includes depositing an insulation layer on the bond pad.

9. The method of claim 8, wherein the insulation layer includes silicon carbide (SiC) or amorphous silicon.

10. The method of claim 1, wherein the step of etching the first substrate includes inductive coupling plasma (ICP) etch.

11. The method of claim 1, further comprising: after bonding, reducing a thickness of the first substrate, the second substrate, or both, by grinding.

12. The method of claim 1, wherein the first substrate has a thickness between 100 μm~200 μm.

13. The method of claim 1, wherein the step of bonding the capping wafer and the device wafer includes: providing at least one bonding layer between the capping wafer and the device wafer to bond both wafers together.

14. The method of claim 13, wherein the step of bonding the capping wafer and the device wafer is by hermetical package or non-hermetical package.

15. The method of claim 14, wherein the hermetical package includes glass frit or solder.

16. The method of claim 15, wherein when the hermetical package includes solder, the at least one bonding layer is made of a material including metal or one of the following alloys: aluminum-silicon alloy, silicon-gold alloy, tin-silver alloy, gold-germanium alloy, gold-tin alloy, and lead-tin alloy.

17. The method of claim 14, wherein when the step of bonding the capping wafer and the device wafer is by non-hermetical package, the at least one bonding layer is made of a material including photosensitive polymer.

18. The method of claim 14, wherein the at least one bonding layer is made of a material including one of the followings: parylene, PDMS (Polydimethylsiloxane), epoxy, or photo-imagable resin.

19. The method of claim 1, wherein the step of making the capping wafer includes:

before etching to form the via, defining a pattern of the etch stop layer, such that at least a portion of the etch stop layer covers a position of the via to be formed in the first substrate.

20. The method of claim 1, wherein the step of making the capping wafer includes:

before etching to form the via, defining a pattern on the first substrate, the pattern at least covering a position of the via to be formed in the first substrate;

etching the first substrate according to the pattern; and forming the etch stop layer within the etched region of the first substrate.

* * * * *